United States Patent [19]

Kitamura et al.

[11] Patent Number: 4,525,841
[45] Date of Patent: Jun. 25, 1985

[54] DOUBLE CHANNEL PLANAR BURIED HETEROSTRUCTURE LASER

[75] Inventors: Mitsuhiro Kitamura; Ikuo Mito; Kohroh Kobayashi, all of Tokyo, Japan

[73] Assignee: Nippon Electric Co., Ltd., Tokyo, Japan

[21] Appl. No.: 434,990

[22] Filed: Oct. 18, 1982

[30] Foreign Application Priority Data

Oct. 19, 1981 [JP] Japan ................... 56-166666
Dec. 23, 1981 [JP] Japan ................... 56-208789
Jan. 29, 1982 [JP] Japan ................... 57-13451
Feb. 19, 1982 [JP] Japan ................... 57-25715

[51] Int. Cl.³ ............................................. H01S 3/19
[52] U.S. Cl. ............................. 372/48; 357/17; 372/46
[58] Field of Search ................... 372/44, 45, 46, 48; 357/17

[56] References Cited

U.S. PATENT DOCUMENTS 4,425,650 1/1984 Mito et al. ................. 372/46

Primary Examiner—James W. Davie
Attorney, Agent, or Firm—Sughrue, Mion, Zinn, Macpeak, and Seas

[57] ABSTRACT

A buried heterostructure semiconductor laser diode with improved efficiency, CW operating temperature and output characteristic is comprised of a semiconductor substrate of a first conductivity type and includes successively at least a first cladding semiconductor layer of the first conductivity type, an active semiconductor layer, and a second cladding semiconductor layer of a second conductivity type. The active semiconductor layer has a narrower bandgap than those of the first and second cladding semiconductor layers. The multilayer double heterostructure has a stripe geometry with channels formed along both sides of the stripe and extending down to the first cladding layer. A current blocking layer is formed on the multilayer double heterostructure except for the top surface of the stripe geometry, in order to block a current flow therethrough.

17 Claims, 11 Drawing Figures

DOUBLE CHANNEL PLANAR BURIED HETEROSTRUCTURE LASER

BACKGROUND OF THE INVENTION

The present invention relates to buried heterostructure semiconductor lasers in which a radiative recombination active layer is buried in semiconductor materials which are larger in bandgap but smaller in refractive index than the active layer. More particularly, the present invention is concerned with an improved semiconductor laser having a desirable efficiency, CW (continuous wave) operating temperature and output characteristic.

Buried heterostructure semiconductor laser diodes (BH-LD) are particularly attractive as light sources for long-distance, largecapacity optical fiber communication systems due to their low lasing threshold current, stable fundamental lateral mode operation and their CW operability at high temperature.

The inventors of the present application achieved an BH-LD excellent in temperature characteristics and reproducibility, in which a current blocking layer is formed on both sides of a mesa stripe which includes a radiative recombination active layer, as disclosed in Japanese Patent Application No. 55-48665/1980, laid open on Nov. 13, 1981 as Japanese Patent Laid Open Publication No. 56-146288 (corresponding to U.S. Pat. No. 4,425,650). A BH-LD using an InP substrate and a InGaAsP system material accomplished a lasing threshold current of 20 mA, a differential quantum efficiency of 60% and a maximum CW operating temperature on the order of 100° C.

However, this type of BH-LD is not satisfactory with regard to the reproducibility of its characteristics. Taking the injection current to light output characteristic, for example, experiments have shown that the BH-LD has a sharp tendency to output saturate as the light output power per facet approaches 15–20 mW and becomes hardly operable for light output power equal to or larger than 30 mW per facet. It was found that the saturation of light output power results from a deficiency in the blocking layer structure.

SUMMARY OF THE INVENTION

It is therefore an object of the present invention to provide a BH-LD in which blocking layers effectively function to enhance the temperature and output characteristics of the BH-LD to an unprecedented degree while also enhancing the reproducibility and yield of manufacture.

A semiconductor laser having a buried double heterostructure embodying the present invention includes a semiconductor substrate of a first conductivity type. A multi-layer double heterostructure includes successively at least a first cladding semiconductor layer of the first conductivity type, an active semiconductor layer, and a second cladding semiconductor layer of a second conductivity type. The active semiconductor layer has a narrower bandgap than those of the first and second cladding semiconductor layers. The multi-layer double heterostructure has a stripe geometry with channels formed along both sides of the stripe and extending down to the first cladding layer. A current blocking layer is formed on the multi-layer double heterostructure except for the top surface of the stripe geometry, in order to block a current flow therethrough. A pair of electrodes supply a voltage to forward bias the semiconductor laser.

A p-n-p-n thyristor structure is generally analyzed using a model connection of a p-n-p transistor and an n-p-n transistor. Concerning the characteristics of a thyristor itself, it is preferable that the thyristor turn-on voltage undergo a substantial change in response to a change in gate current. This conflicts with the requirement that the turn-on voltage of a blacking layering in a semiconductor laser change little in response to a change in gate current. Stated another way, a thyristor with poor performance is rather suitable for a blocking layer structure. Such a thyristor is achievable by reducing the current gain of one or both of the p-n-p and n-p-n transistors. It may roughly be said that the current gain of a transistor can be reduced by reducing the current carried by the minority carriers at the base relative to the total emitter current. In a p-n-p-n thyristor structure having an n-InP buffer layer, p-InP blocking layer, n-InP blocking layer and p-InP blocking layer, for example, introducing an InGaAsP layer of a small bandgap in an n-p-n transistor to make its structure P-N-P-p-N type (The combination of capital and small letters are used hereunder to designate a layer of a smaller bandgap to be introduced in a thyristor structure.) significantly reduces the current gain and thereby prevents the thyristor turn-on voltage from being affected by the gate current. In other words, applying the P-N-P-p-N thyristor structure to the blocking layers remarkably suppresses a leakage current which results from the thyristor breakdown of the BH-LD.

BRIEF DESCRIPTION OF THE DRAWINGS

The present invention will be described in greater detail with reference to the accompanying drawings in which.

DESCRIPTION OF THE PREFERRED EMBODIMENTS

Figure 1:
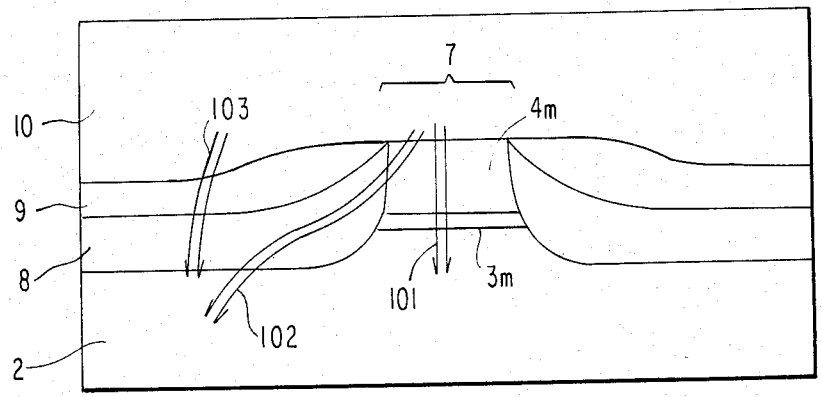
FIG. 1 is a section of a prior art semiconductor laser described in Japanese Patent Laid Open Publication No. 56-146288 (U.S. Pat. No. 4,425,650) and taken in a plane normal to the optical axis thereof, current flow directions being indicated by arrows.

In FIG. 1 of the drawings, which represents prior art, a current flows into a mesa stripe 7 through a window formed in an n-InP current blocking layer 9. While a majority of the current injects itself into a radiative recombination active layer 3m as an effective current 101 for the BH-LD, the remainder is allowed to flow into a p-InP current blocking layer 8 through a p-InP cladding layer 4m and farther into an n-InP buffer layer 2. This current, though fractional, serves as a gate current 102 for the p-n-p-n thyristor structure at opposite sides of the mesa stripe, promoting turn-on of the p-n-p-n current blocking layer structure. Some elements with such a BH-LD structure clearly showed a blocking layer turn-on effect in which the light output power sharply decreased in response to a rise of an injection current beyond a certain level. Apart from the decrease in light output power, the proportion of the leakage current progressively increased relative to the total injection current as would result from the so-called "soft breakdown". This enhanced the tendency to saturation in the current to light output characteristic thereby disabling light output power on the order of 20-30 mW from being achieved. In addition to the fractional leakage current flowing from the p-InP cladding layer 4 m into the n-InP buffer layer 2 via the blocking layer 8, a substantial amount of leakage current 103 originated from the turn-on of the p-n-p-n blocking layer which was in turn caused by the fractional leakage current. Thus, the p-n-p-n thyristor structure did not effectively work as a blocking region.

Figure 2:
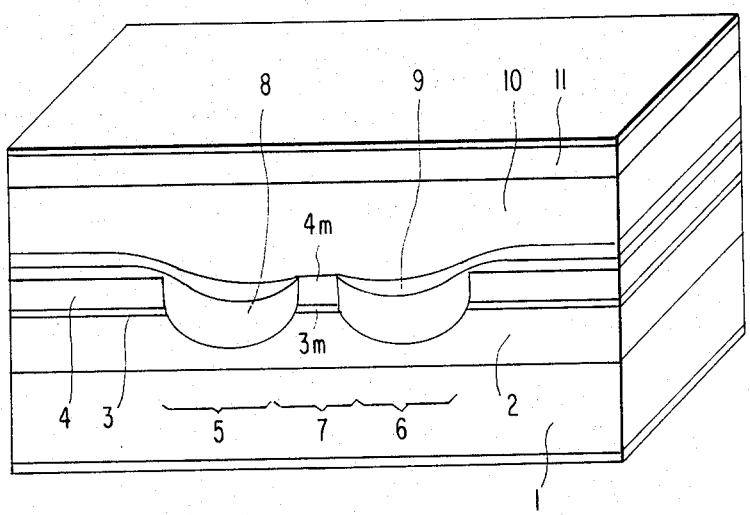
FIG. 2 is a perspective view of a BH-LD according to a first embodiment of the present invention.

Referring to FIG. 2, a BH-LD according to a first embodiment of the present invention is shown in perspective. First, a process for manufacturing the illustrated BH-LD will be described. A double heterostructure (DH) is made by successively growing, on a (100) oriented n-InP substrate 1, an n-InP buffer layer 2 (5 microns thick, Sn-doped, $1 \times 10^{18}$ cm$^{-3}$), a non-doped $In_{0.72}Ga_{0.28}As_{0.61}P_{0.39}$ active layer 3 (0.1 micron thick) and a p-InP cladding layer 4 (1 micron thick, Zn-doped, $1 \times 10^{18}$ cm$^{-3}$). The active layer 3 corresponds to an emitting wavelength of 1.3 microns. The DH wafer is treated with a usual photoresist and chemical etching process to be formed with two parallel channels 5 and 6 in the <011> direction and a mesa stripe 7 defined between the channels 5 and 6. The mesa stripe 7 may be 1.5 microns wide in the active layer portion and the channels 5 and 6 may both be about 10 microns wide and about 3 microns deep. In practice, etching was carried out at 3° C. for 2 minutes and 30 seconds using a bromine (Br)-methanol solution which had a volumetric ratio of 0.2%. Epitoxial growth is effected on the semiconductor wafer which has been formed with the mesa stripe 7 inclusive of the active layer 3m and the parallel channels 5 and 6. This gives a p-InP blocking layer 8 and an n-InP blocking layer 9 successively on the semiconductor wafer except for the top surface of the mesa stripe 7, a p-InP embedding layer 10 and a p-$In_{0.85}Ga_{0.15}As_{0.33}P_{0.67}$ electrode layer 11 are subsequently formed throughout the entire surface. The electrode layer 11 has a bandgap corresponding to an emitting wavelength of 1.1 microns. The p- and n-InP blocking layers 8 and 9 are both produced by liquid phase epitaxial (LPE) growth employing a two phase solution in which a single InP crystal floats in an In growth melt. Such selective epitaxial growth is possible because the growth proceeds so fast at the sides of the mesa that phosphorus (P), a minor atom contained in the melt, centers on the side portion with its concentration on the top of the mesa stripe 7 decreased. In accordance with the present invention, such characteristics of crystal growth discovered by the inventors is effectively made use of to realize a unique BH structure. (Reference is made to Japanese Patent Laid Open Publication No. 56-146288/1981 corresponding to U.S. Ser. No. Pat. No. 4,425,650) After the embedding growth, the wafer is processed into the desired BH-LD by forming electrodes, preparing a pair of reflective end surfaces functioning as a resonator by the cleavage of (011) surfaces and pelletizing it.

Figure 3:
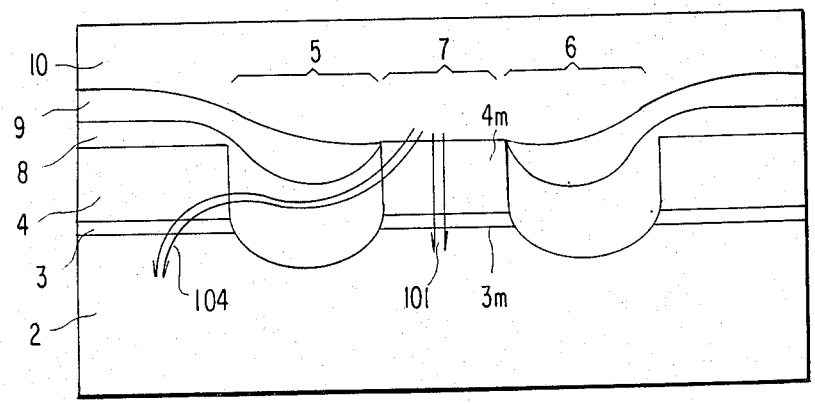
FIG. 3 is a fragmentary section of the BH-LD of FIG. 2 taken in a plane normal to its optical axis and showing a mesa stripe and its neighborhood, current flow directions being also indicated by arrows.

The flow of currents through the structure described above will be examined with reference to FIG. 3. The major part of a current flow into the p-InP cladding layer 4m is injected into the active layer 3 m. A leakage current 104 is steered clear of the active layer 3m and flows through the path constituted by the p-InP cladding layer 4m, p-InP blocking layer 8, p-InP cladding layer 4, active layer 3 and n-InP buffer layer 2. As previously stated, the leakage current 104 acts as a gate current for the P-N-P-p-N thyristor structure (though the active layer 3 is non-doped in nature, it is considered to have turned to p-type during the LPE growth of p-InP due to auto-diffusion of Zn with which the InP is doped) formed at opposite sides of the channels 5 and 6. Nevertheless, the P-N-P-p-N structure is barely affected by the gate current and scarcely caused to turn on. Meanwhile, though the area of the channels 5 and 6 involves a p-n-p-n-InP blocking layer structure, the leakage current 104 does not flow into the n-InP buffer layer 2 but only passes through the p-InP blocking layer 8 and, accordingly, it cannot act as a gate current for the p-n-p-n thyristor. It will thus be seen that in the BH-LD according to the above embodiment, a current is allowed to flow concentratively to the mesa stripe 7, that is, there is no leakage current which would otherwise flow through the entire surface due to the turn-on of the current blocking layer structure.

With the BH-LD structure stated above, we have accomplished an element which has a CW threshold current of 15–20 mA at room temperature, a differential quantum efficiency of 60–70%, an I-L characteristic with linearity up to the light output power of 40 mW per facet, and a maximum output power higher than 100 mW. The reproducibility of such characteristics was also found to be excellent.

Because the BH-LD according to the embodiment had the mesa stripe 7 defined by the two parallel channels 5 and 6, semiconductor layers of a small-bandgap active layer composition remained outside the channels and they made it possible to prevent the thyristor structure from turning on, as previously mentioned. In the embedding crystal growth, the crystal growth was always started from inside the channels so that the resulting reproducibility was extremely high with a minimum of scattering among wafers. Moreover, because the crystal growth was effected such that the entire wafer surface with the two channels was covered after the deposition of the p-n blocking layer, the resulting crystal surface was flat enough to eliminate excessive stresses during die bonding or wire bonding of pellets. As a result there was a remarkable increase in the yield of manufacture.

Figure 4A:
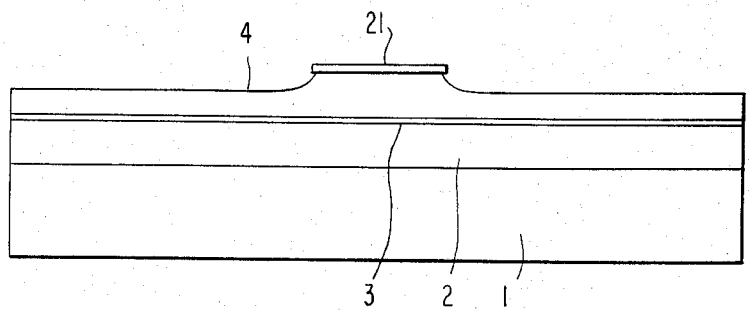
FIGS. 4A–4C and 5A–5C are sections representing different steps for manufacturing BH-LD's in accordance with second and third embodiments of the present invention, respectively.
Figure 4B:
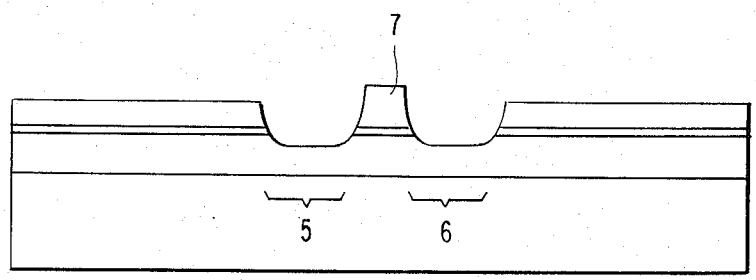
Figure 4C:
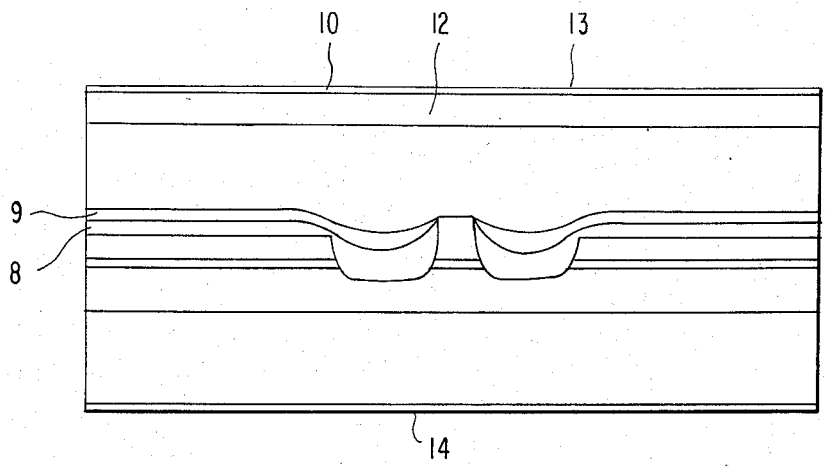

Referring to FIGS. 4A-4C, there is schematically shown a series of steps for manufacturing a BH-LD in accordance with a second embodiment of the present invention. What is unique to this embodiment is that the mesa stripe 7 is formed at a level higher than the rest of the BH-LD. This structure attains an additional improvement in the reproducibility of crystal growth and the yield of manufacture.

As shown in FIG. 4A, a multi-layer semiconductor wafer is prepared by successively growing, on a (100) oriented n-InP substrate 1, an n-InP buffer layer 2, a non-doped $In_{0.72}Ga_{0.28}As_{0.61}P_{0.39}$ active layer 3 corresponding to an emitting wavelength of 1.3 microns, and a p-InP cladding layer 4. A 10 micron wide etching mask 21 is formed on the wafer along the <011> direction using a usual photoresist. The p-InP cladding layer 4 is deposited to a thickness of about 1–2 microns and then etched to a depth of about 0.5 micron except for the etching mask 21. Thereafter, as shown in FIG. 4B, two parallel channels 5 and 6 are formed by a photolithographic procedure in that part of the wafer configuration where the mask 21 is located, thereby defining a mesa stripe 7. The mesa stripe 7 may be 1–2 microns wide and each channel may be 6–7 microns wide. In this situation, the p-InP cladding layer 4 in the mesa stripe portion is thicker than the p-InP layer left in the other portion by the amount which was not etched at first, i.e. about 0.5 micron. Then the wafer etched in two stages is subjected to embedding growth as indicated in FIG. 4C. A p-InP blocking layer 8 and an n-InP blocking layer 9 are successively grown on the wafer except for the top of the mesa stripe 7. This is followed by the deposition of a p-InP embedding layer 10 and a p-$In_{0.72}Ga_{0.28}As_{0.61}P_{0.39}$ electrode layer 12 which corresponds to an emitting wavelength of 1.3 microns, each covering the entire surface of the wafer. Finally, a p-type ohmic electrode 13 and an n-type ohmic layer 14 are formed on the electrode layer 12 and substrate 1, respectively, so as to complete the desired $In_{1-x}Ga_x$-$As_{1-y}P_y$ BH-LD.

The BH-LD shown in FIGS. 4A–4C is significant in that the level of the mesa stripe 7, higher than the other portions, permits the blocking layers 8 and 9 to grow smoothly even at the edges of the channels 5 and 6. Particularly, the height of the mesa stripe 7 makes it unlikely that the n-InP blocking layer 9 will cover the top of the mesa stripe 7, even when the layer 9 is grown to a somewhat larger thickness. This offers a wider range of tolerances for the growth of the blocking layers and, accordingly, remarkably improves the reproducibility of embedding growth. The BH-LD thus manufactured provides elements which show a threshold current of 10–20 mA and a differential quantum efficiency of about 50%, with the scattering minimized.

Figure 5A:
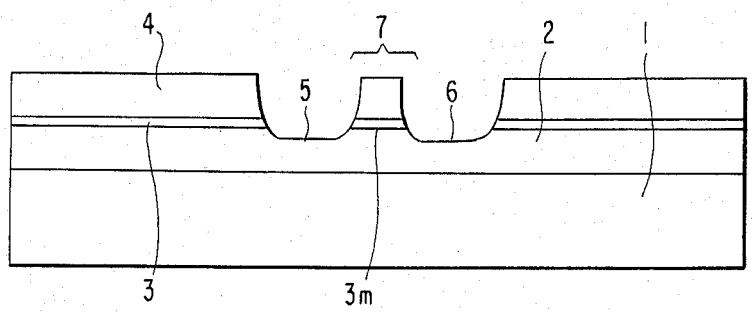
Figure 5B:
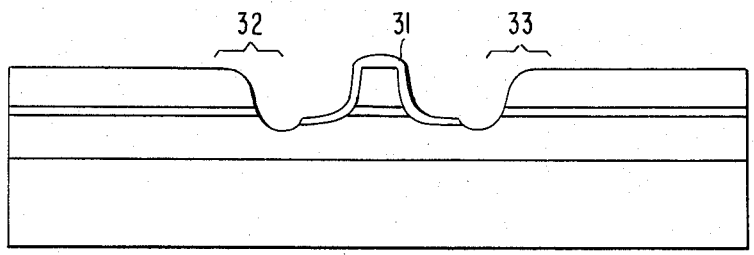
Figure 5C:
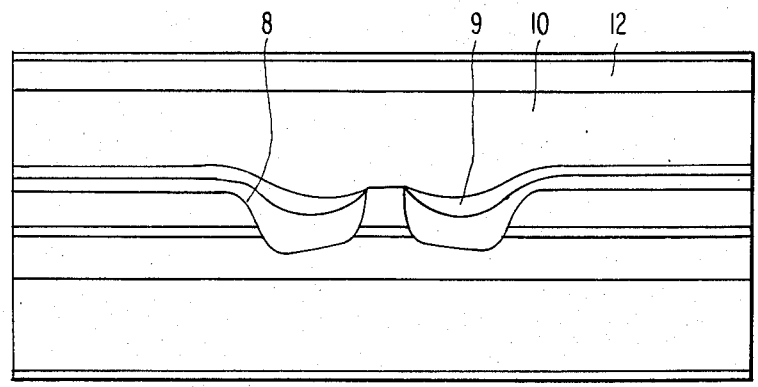

Referring to FIGS. 5A–5C, a BH-LD in accordance with a third embodiment of the present invention comprises a semiconductor wafer which is made by successively depositing, on a (100) oriented n-InP substrate 1, an n-InP buffer layer 2, an $In_{0.72}Ga_{0.28}As_{0.61}P_{0.39}$ active layer 3 and a p-InP cladding layer 4. The wafer is formed with two parallel channels 5 and 6 along the <011> direction and a mesa stripe 7 defined between the channels 5 and 6. This can be done with ease employing an ordinary photoresist and chemical etching process. Each of the channels 5 and 6 may be 10 microns wide and the mesa stripe 7, including the radiative recombination active layer, may be about 2 microns wide and 2 microns high. The resulting configuration is illustrated in FIG. 5A. Then, as seen in FIG. 5B, a photoresist mask 31 is deposited to cover the mesa stripe 7 whereafter the entire surface is etched. An etching depth of about 0.2 micron suffices in the flat portion and this treatment can be readily accomplished making use of, for example, a Br-methanol solution. Because the etching proceeds faster at the square edges of the channels 5 and 6 than at the rest, the edges become rounded as at 32 and 33 shown in FIG. 5B. After the removal of the photoresist mask 31, embedding growth is carried out as indicated in FIG. 5C. A p-InP blocking layer 8 and an n-InP blocking layer 9 are successively grown on the wafer except for the top of the mesa stripe 7. This is followed by successive growth of a p-InP embedding layer 10 and a p-$In_{0.72}Ga_{0.28}As_{0.61}P_{0.39}$ electrode layer 12 corresponding to an emitting wavelength of 1.3 microns, thus completing the embedding growth. Experiments have shown that both the p- and n-InP blocking layers 8 and 9 grow smoothly along the opposite edges 32 and 33 of the channels 5 and 6 remote from the mesa stripe 7, because those edges are rounded by etching. Furthermore, the two blocking layers 8 and 9 are prevented from covering the top of the mesa stripe 7 so that the spread in characteristics attributable to the blocking layers is noticeably reduced and a marked increase in the yield of manufacture is realized.

Figure 6:
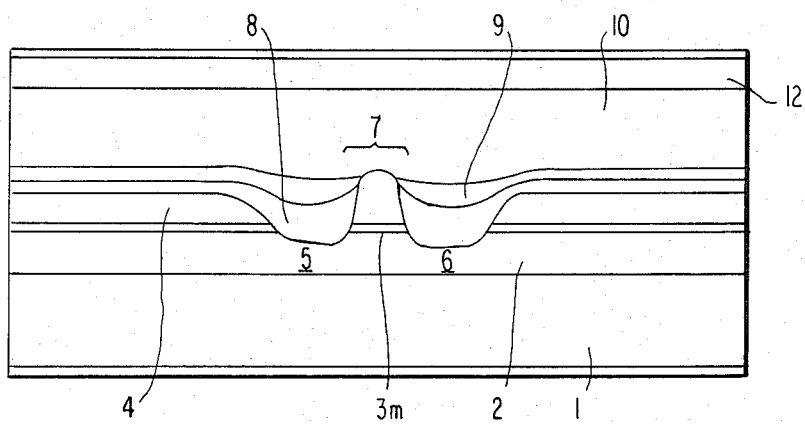
FIGS. 6 and 7 are sections showing fourth and fifth embodiments of the present invention, respectively.

In FIG. 6, there is shown a fourth embodiment of the present invention which is manufactured by a procedure substantially common to the combined procedure of the second and third embodiments. In this embodiment, the embedding growth is carried out on a multilayer semiconductor wafer which has a mesa stripe 7 with an active layer 3m and two parallel channels 5 and 6 at opposite sides of the mesa stripe 7. Before forming the parallel channels 5 and 6, the entire surface is etched to a depth of about 0.5–1 micron except for 0.5–1 micron around the mesa stripe 7. Then, the channels 5 and 6 are shaped by etching such that the mesa stripe 7 stands higher than the surrounding portions. The mesa stripe 7 may be about 2–3 microns wide and about 3 microns high while each of the etching channels 5 and 6 may be 10 microns wide. The mesa stripe 7 is higher than the surrounding area by 0.1–1 micron due to the initial etching. Finally, the entire surface is etched to a depth of about 0.2 micron in the flat portion by means of a Br-methanol solution. Embedding growth is effected on the resultant semiconductor wafer to attain the desired BH-LD. Thus, in the fourth embodiment described, the mesa stripe 7 is formed somewhat higher than the surrounding portions and the entire surface is etched, so that the side edges of the channels 5 and 6 are rounded. This promotes smooth growth of the p-and n-InP blocking layers 8 and 9 without any discontinuity at the side edges of the channels 5 and 6. Due to the unique level of the mesa stripe 7, the blocking layer 8 or 9 is prevented from covering the top of the mesa stripe 7. Such a BH-LD structure features a minimum of spread in characteristics and a far greater yield of manufacture over the foregoing embodiments. With the InGaAsP/InP BH-LD thus manufactured, elements were achieved having a threshold current of 20 mA at room temperature, a differential quantum efficiency of 60%, and a characteristic temperature of 70° K. at near room temperature. Furthermore, a spread in characteristics was not noticeable while the reproducibility of the wafers was excellent.

In the third and fourth embodiments described above, in order to round opposite edges of the channels after forming the mesa stripe, which included the active layer, an additional photoresist mask has been formed to protect the mesa stripe or the mesa stripe has been shaped higher than the surrounding portions prior to etching the entire surface. This is for illustrative purpose only. Instead, the entire surface may be etched after forming a narrow mesa stripe and channels at opposite sides of the narrow mesa stripe. The narrow mesa stripe, though not higher than its surrounding portion, still keeps the blocking layers from growing thereon due to its narrowness. Any other methods may be employed insofar as they include a step of rounding the edges of the channels remote from the mesa stripe. Furthermore, a dry etching process may be employed in place of the wet chemical etchng shown and described.

Figure 7:
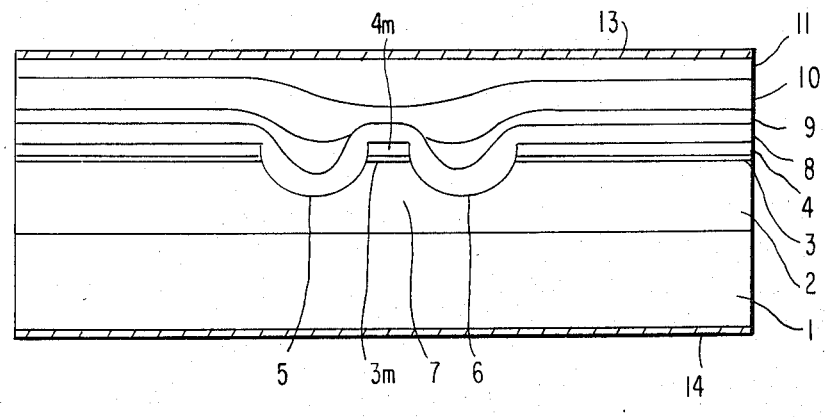

Referring to FIG. 7, a fifth embodiment of the present invention is shown which follows the same procedure as the first to fourth embodiments up to the step of shaping the mesa stripe 7, but features modified embedding growth. In making the DH wafer, the carrier concentration in the p-InP cladding layer 4 is made as small as about $3 \times 10^{17}$ cm$^{-3}$ for the purpose which will be described. In the LPE embedding growth, the degree of super-saturation is made as high as about 15° so that the p-InP blocking layer 8 (Zn-doped) is deposited on the entire surface to a substantially even thickness of 1 micron. In this instance, the carrier concentration is increased to $3 \times 10^{18}$ cm$^{-3}$. Thereafter, the n-InP blocking layer 9 (Te-doped, $5 \times 10^{18}$ cm$^{-3}$) is grown on the blocking layer 8 except for the top of the mesa stripe 7 by means of a two phase solution whose degree of super saturation is low. This is followed by successive deposition of the p-InP embedding layer 10 (An-doped, $2 \times 10^{18}$ cm$^{-3}$, 2 microns thick in the flat portion) and a p-InGaAsP cap layer 11 (corresponding to an emitting wavelength of 1.1 microns, Zn-doped, $5 \times 10^{18}$ cm$^{-3}$) to a thickness of about 0.5 micron in the flat portion, which renders the entire surface substantially flat. Finally, a p-type electrode 13 consisting of Au-Zn is formed on the cap layer 11 and an n-type electrode 14 consisting of Au-Sn is formed on the substrate 1. The product is then cleaved into elements.

When a bias voltage is applied across the element with the p-side held positive and the n-side held negative, the P-N-P-p-N layer structure effectively confines the injection current in the active waveguide 3m. The element, therefore, starts lasing at an injection current as low as about 20 mA. Because the active layer is as thin as 0.1 micron, the electric field of light propagating through the resonator is confined only to a ratio of 15% in the active layer whose internal absorption loss is substantial. Though the electric field radiated from the active layer undergoes absorption loss due mainly to the free carriers in the p-InP cladding layer mesa portion 4m, the loss is negligible because the carrier concentration in the mesa portion 4m is not more than $3 \times 10^{17}$ cm$^{-3}$. Hence, a differential quantum efficiency as high as 70% is achievable in injection current to light output characteristic. Meanwhile, the low carrier concentration in the p-InP cladding layer 4 results in a decrease in the hereto barrier between the p-InGaAs active layer 3 and the p-InP cladding layer 4. Furthermore, the carriers that escape over the hetero barrier can be retained within the p-InP cladding layer mesa portion 4m by depositing on the mesa portion 4m the p-InP blocking layer 8 having a high carrier concentration. The temperature characteristic, however, remains good even though the carrier concentration in the p-InP cladding layer 4 may be lowered to enhance the differential quantum efficiency; the parameter To indicating the temperature-dependency of the lasing threshold current, which is generally regarded through experience to vary as expressed by exp (T/To), is about 75° K. and the maximum CW operating temperature is 130° C. Due to the high differential quantum efficiency, an injection current as low as 200 mA is enough to achieve light output power of 50 mW per facet and the maximum pulse light output per facet of 200 mW.

Additionally, in the epitaxial growth, the p-InP blocking layer 5 is deposited at first on the entire surface using a solution having a high degree of supersaturation. This promotes good "wetting" in the epitaxial growth which in turn makes the sectional shape of growth within the wafer very uniform, thereby realizing a high yield of manufacture with a minimum of spread in characteristics.

Though the BH-LD in each of the foregoing embodiments has made use of semiconductor materials having a wavelength range of 1 micron, such as $In_{1-x}Ga_xAs_yP_{1-y}$ and InP, any other semiconductor material may be used such as a $Ga_{1-x}Al_xAs/GaAs$ system, $In_xGa_{1-x}As_{1-y}P_y/GaAs$ system, or InAlGaAs or InGaAsSb system in order to cover a wider wavelength range from the visible to the farinfrared.

In all the five foregoing embodiments, none of the p-InP and n-InP blocking layers 8 and 9 is deposited on the mesa top. However, it is permissible to form in advance a p-type inversion layer based on diffusion or the like on the surfaces of the channels 5 and 6 and then deposit only the n-InP blocking layer except for the mesa top.

Further, while in each embodiment the p-InP embedding layer 10 has been formed throughout the surface inclusive of the mesa top in order to make the element surface flat, such a structure is not limiting but may be replaced by another in which etching is effected to the reverse mesa configuration, the mesa top is covered with $SiO_2$ or the like, and the blocking layer only is grown by the second LPE.

What is claimed is:

1. A semiconductor laser having a buried double heterostructure, comprising:
    a semiconductor substrate of a first conductivity type;
    a multi-layer double heterostructure including successively at least a first cladding semiconductor layer of the first conductivity type, an active semiconductor layer, and a second cladding semiconductor layer of a second conductivity type, said active semiconductor layer having a narrower bandgap than those of said first and second cladding semiconductor layers, said multi-layer double heterostructure having a stripe portion with channels formed along both sides of said stripe and extending through said second cladding semiconductor layer and active semiconductor layer to reach said first cladding layer, and having remaining portions, outside said channels, including said first, active, and second semiconductor layers;
    a current blocking layer formed on said channels and said remaining portions of said multilayer double heterostructure except for the top surface of said stripe portion, for blocking a current flow therethrough;
    resonant means for feeding light back in the opposite directions of the length of said stripe and parallel to said active semiconductor layer; and
    a pair of electrodes for supplying a voltage to forward bias said semiconductor laser.

2. The semiconductor laser as set forth in claim 1, wherein said current blocking layer comprises at least a first blocking semiconductor layer and a second blocking semiconductor layer opposite in conductivity type to said first blocking semiconductor layer.

3. The semiconductor laser as set forth in claim 1, wherein a portion of said second cladding layer overlying said stripe portion is thicker than other portions of said second cladding layer.

4. The semiconductor laser as set forth in claim 2, wherein a portion of said second cladding layer overlying said stripe portion is thicker than other portions of said second cladding layer.

5. The semiconductor laser as set forth in claim 1, further comprising a burying semiconductor layer of the second conductivity type which is grown to bury the top surface of the stripe geometry and the current blocking layer to form a flat surface.

6. The semiconductor laser as set forth in claim 2, further comprising a burying semiconductor layer of the second conductivity type which is grown to bury the top surface of the stripe geometry and the current blocking layer to form a flat surface.

7. The semiconductor laser as set forth in claim 2, wherein the first blocking semiconductor layer is of the second conductivity type and the second blocking semiconductor layer is of the first conductivity type.

8. The semiconductor laser as set forth in claim 6, wherein the first blocking semiconductor layer is of the second conductivity type and the second blocking semiconductor layer is of the first conductivity type.

9. The semiconductor laser as set forth in claim 1, wherein edges of said channels are formed round in shape.

10. The semiconductor laser as set forth in claim 4, wherein edges of said channels are formed round in shape.

11. The semiconductor laser as set forth in claim 2, wherein the first blocking layer is made within the first cladding layer by diffusion.

12. The semiconductor laser as set forth in claim 10, wherein the first blocking layer is made within the first cladding layer by diffusion.

13. A semiconductor laser having a buried double heterostructure, comprising:
a semiconductor substrate of a first conductivity type;
a multi-layer double heterostructure including successively at least a first cladding semiconductor layer of the first conductivity type, an active semiconductor layer, and a second cladding semiconductor layer of a second conductivity type, said active semiconductor layer having a narrower bandgap than those of said first and second cladding semiconductor layers, said multi-layer double heterostructure having a stripe portion with channels formed along both sides of said stripe portion and extending through said second cladding layer and active layer to reach said first cladding layer, and having remaining portions, outside said channels, including said first, active, and second semiconductor layers;
a further semiconductor layer of the second conductivity type formed on said channels and said remaining portions of said multi-layer double heterostructure;
a blocking semiconductor layer of the first conductivity type formed on said further semiconductor layer except for the top surface of said stripe portion, for blocking a current flow therethrough;
resonant means for feeding light back in the opposite directions of the lengths of said stripe and parallel to said active semiconductor layer; and
a pair of electrodes for supplying a voltage to forward bias said semiconductor laser.

14. A semiconductor laser as set forth in claim 13, wherein said second cladding semiconductor layer has a carrier concentration no more than approximately $3 \times 10^{17}$ cm$^{-3}$.

15. A semiconductor laser having a buried double heterostructure, comprising:
a double heterostructure including successively at least a first semiconductor material of a first conductivity type, a second semiconductor material, and a third semiconductor material of a second conductivity type, said second semiconductor material having a narrower bandgap than those of said first and third semiconductor materials and emitting radiation under the forward bias of a p-n junction, said double heterostructure having a stripe portion with channels formed along both sides of said stripe and extending through said third semiconductor material and said second semiconductor material to reach said first semiconductor material, and having remaining portions, outside said channels, including said first, second, and third semiconductor materials;
a fourth semiconductor material of the second conductivity type formed over said channels and said remaining portions of said double heterostructure except for the top surface of said stripe portion;
a fifth semiconductor material of the first conductivity type formed over said fourth semiconductor material;
resonant means for feeding light back in the opposite directions of the length of said stripe and parallel to a layer of said second semiconductor material; and
a pair of electrodes for supplying a voltage to forward bias said semiconductor laser.

16. A semiconductor laser as set forth in claim 15, further including a sixth semiconductor material of the second conductivity type formed over said fifth semiconductor material and said top of the stripe.

17. A semiconductor laser as set forth in claim 16, wherein said feedback means includes a pair of opposite resonator facets.

* * * * *

UNITED STATES PATENT AND TRADEMARK OFFICE
CERTIFICATE OF CORRECTION

PATENT NO. : 4,525,841

DATED : June 25, 1985

INVENTOR(S) : Mitsuhiro KITAMURA; Ikuo MITO; Kohroh KOBAYASHI

It is certified that error appears in the above-identified patent and that said Letters Patent is hereby corrected as shown below:

Column 1, line 17, "change "largecapacity" to --large capacity--.

line 21, change "an" to --a--.

Column 2, line 9, change "blacking" to --blocking--.

Column 3, line 40, change "Epitoxial" to --Epitaxial--.

line 63, delete "Ser. No."

line 64, change "4,425,650)" to --4,425,650.)--.

Signed and Sealed this

Thirty-first Day of December 1985

[SEAL]

Attest:

DONALD J. QUIGG

Attesting Officer

Commissioner of Patents and Trademarks